United States Patent [19]
Stikvoort

[11] Patent Number: 4,604,720
[45] Date of Patent: Aug. 5, 1986

[54] INTERPOLATING FILTER ARRANGEMENT WITH NON-RATIONAL RATIO BETWEEN THE INPUT AND THE OUTPUT SAMPLING FREQUENCIES

[75] Inventor: Eduard F. Stikvoort, Eindhoven, Netherlands

[73] Assignee: U.S. Philips Corporation, New York, N.Y.

[21] Appl. No.: 590,096

[22] Filed: Mar. 16, 1984

[30] Foreign Application Priority Data

Jan. 10, 1984 [NL] Netherlands .......................... 8400073

[51] Int. Cl.$^4$ ............................................ G06F 15/31
[52] U.S. Cl. .................................................. 364/724
[58] Field of Search .............................. 364/724, 723; 340/347 DD

[56] References Cited

U.S. PATENT DOCUMENTS

| | | | |
|---|---|---|---|
| 3,829,670 | 8/1974 | Kebabian | 364/724 |
| 3,997,773 | 12/1976 | Van Essen et al. | 364/723 |
| 4,020,332 | 4/1977 | Crochiere et al. | 364/724 |
| 4,270,026 | 5/1981 | Shenoi et al. | 364/724 |
| 4,460,890 | 7/1984 | Busby | 340/347 DD |

OTHER PUBLICATIONS

Crochiere, "Further Considerations in the Design of Decimators and Interpolators", *IEEE Trans. on Acoustics, Speech, and Signal Processing*, vol. ASSP-24, No. 4, Aug. 1976, pp. 296-311.
Wong et al., "Commutatively & Application of Digital Interpolation Filters & Modulators", *IEEE Trans. on Communications*, vol. COM-28, No. 2, Feb. 1980, pp. 244-249.

Primary Examiner—David H. Malzahn
Attorney, Agent, or Firm—Thomas A. Briody; William J. Streeter; Marianne R. Rich

[57] ABSTRACT

Interpolating time-discrete filter arrangement for increasing the sampling frequency of a time-discrete signal from $f_i$ to $f_u$, $f_u$ not being a rational multiple of $f_i$. For the generation of the required filter coefficients this filter arrangement comprises clock pulse generators which produce input clock pulses ki(q) at a rate $f_i$ and output clock pulses ku(n) at a rate $f_u$. It also comprises a coefficients generator in which a deviation component d(q) is calculated which indicates the relationship between the time interval $T_{d(q)}$ located between an input clock pulse $k_i(q)$ and the immediately preceding or the immediately subsequent output clock pulse ku(n) and the time interval $T_u = 1/f_u$ between two consecutive output clock pulses ku(n). In response to this deviation component the filter coefficients generator produces W filter coefficients, the w$^{th}$ filter coefficient ($w=0, 1, 2, 3, \ldots W-1$) being equal to a(d(q),w) and being defined by the expression $$a(d(q),w) = h(d(q)T_u + wT_u)$$

Herein the function h(v) represents the impulse response of a FIR filter and v a continuous variable in the interval $-\infty < v < \infty$.

5 Claims, 11 Drawing Figures

INTERPOLATING FILTER ARRANGEMENT WITH NON-RATIONAL RATIO BETWEEN THE INPUT AND THE OUTPUT SAMPLING FREQUENCIES

A. BACKGROUND OF THE INVENTION

A(1) Field of the invention

The invention relates to an interpolating time-discrete filter arrangement for converting a time-discrete input signal with which an input sampling frequency $f_i$ is associated into a time-discrete output signal with which an output sampling frequency $f_u$ is associated which is higher than the input sampling frequency.

A(2) Description of the prior art

As is generally known, a time-discrete signal is formed by a series of signal samples. The sampling frequency associated with such a signal indicates the rate at which these signal samples occur. The signal sample itself indicates the magnitude of the signal at a given instant. Within a certain range such a signal sample can assume any value, or only a number of discrete values. In the latter case a digital signal is involved and the signal sample is usually represented by a code word having a plurality of bits.

Hereafter the signal samples of the input signal will be called input samples and be denoted $x(q)$; $q = \ldots -2, -1, 0, 1, 2, 3, \ldots$. Similarly, the signal samples of the output signal will be called output samples and be denoted $y(n)$; $n = \ldots -2, -1, 0, 1, 2, 3, \ldots$.

Interpolating filter arrangements of the above-mentioned type have been known for many years already. For the sake of brevity, for a general survey reference is made to references 1–6 listed in paragraph C. They produce a time-discrete output signal with which an output sampling frequency is associated with such a value that the ratio between the output sampling frequency and the input sampling frequency is a rational number. Usually the output sampling frequency is an integral multiple of the input sampling frequency.

Practical implementations of interpolating filters are extensively described in, for example, the references 3, 4 and 5. As all types of time-discrete filter arrangements they comprise a signal processing circuit to which the time-discrete input signal and also filter coefficients are applied. As is known, these filter coefficients represent samples of the finite impulse response of the filter and are produced by a filter coefficients generator.

However, in practice it has been found that there are situations in which the output sampling frequency is not a rational multiple of the input sampling frequency; it holds, for example, that $f_u = f_i \sqrt{2}$. Such a situation is found in, for example, digital audio equipment which must be intercoupled; for example a digital tuner, a digital tape recorder, a digital record-player, etc. In practice these apparatuses each comprise their own clock generator for generating the sampling pulses required. The frequencies of these clock pulse generators will never be perfectly equal to each other. So as to enable the apparatuses to cooperate with each other the output sampling frequency associated with the digital signal produced by a first apparatus must be made equal to the input sampling frequency accepted by the second apparatus.

B. OBJECT AND SUMMARY OF THE INVENTION

The invention has for its object to provide an interpolating filter arrangement having a non-rational interpolation factor.

According to the invention, this filter arrangement is therefore provided with:

(a) first means for producing input clock pulses $ki(q)$ occurring at the said input sampling frequency $f_i$;

(b) second means for producing output clock pulses $ku(n)$ occurring with the said output sampling frequency $f_u$;

(c) a filter coefficients generator for producing a group of W filter coefficients, the generator comprising:

(c1) means to which the input clock pulses and the output clock pulses are applied and which in response to each input clock pulse $ki(q)$ produces a deviation component $d(q)$ whose magnitude is proportional to the ratio between the time interval $T_{d(q)}$ located between that input clock pulse and the immediately preceding or the immediately subsequent output clock pulse and the time interval $T_u = 1/f_u$ between two consecutive output clock pulses;

(c2) means for producing in response to the deviation component $d(q)$ the group of W filter coefficients, the filter coefficient having number w being equal to $a(d(q),w)$ and being defined by the expression:

$$a(d(q),w) = h(d(q)T_u + wT_u)$$

in which $h(v)$ represents the impulse response of a FIR-filter, v is a continuous variable in the interval $-\infty < v < \infty$;

(d) a signal processing arrangement for generating the output samples $y(n)$ by multiplying the input samples by selected coefficients of said filter coefficients and adding together the products thus obtained.

It should be noted that in the prior art interpolating filter arrangements the same group of filter coefficients is always used. For the filter arrangement according to the invention this group of filter coefficients changes continuously. It should also be noted that in contrast with the prior art interpolating filter arrangement in which the same number of new output samples is supplied after each new input sample, the number of output samples occurring between two input samples changes in the interpolating filter arrangement according to the invention.

C. REFERENCES

1. A digital Processing Approach to Interpolation; R. W. Schafer, L. R. Rabiner; Proceedings of the IEEE, Vol. 61, No. 6, June 1973, pages 692–702.
2. Arrangement for converting discrete signals into a discrete single-sideband signal frequency-multiplexed signal and vice versa; U.S. Pat. No. 4,131,764. Paragraph E(1.2).
3. Digital filter; U.S. Pat. No. 3,928,755.
4. Interpolating digital filter, U.S. Pat. No. 3,988,607.
5. Interpolating digital filter with input buffer; U.S. Pat. No. 3,997,773.
6. Interpolation-Decimation Circuit for Increasing or Decreasing Digital Sampling Frequency; R. E. Crochiere, L. R. Rabiner; U.S. Pat. No. 4,020,332.
7. Theory and Applications of Digital Signal Processing; L. R. Rabiner; B. Gold.

8. Terminology in Digital Signal Processing; L. R. Rabiner, et al; IEEE Transactions on Audio and Electroacoustics, Vol. AU-20, December 1972, pages 322-337.

E. DESCRIPTION OF THE EMBODIMENTS

E(1) Theoretical background

Figure 1:
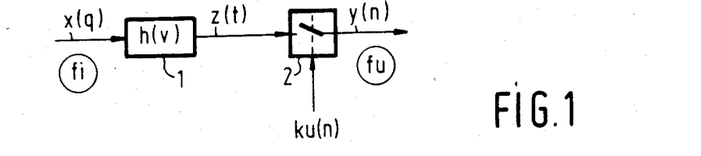
FIG. 1 shows the theoretically functional structure of an interpolating time-discrete filter arrangement.

FIG. 1 shows schematically the theoretical model of a time-discrete filter arrangement for changing the sampling frequency of a time-discrete input signal. It comprises an "analog" filter 1 followed by a sampling arrangement 2. The time-discrete input signal formed by the series of input samples $x(q)$, $q = \ldots -2, -1, 0, 1, 2, 3, \ldots$ which occur at the input sampling frequency $f_i$ are applied to this filter 1. This filter supplies an output signal $z(t)$ which is equal to the sum of all the so-called individual output signals $x_{z(q)}(t)$. The response of this filter 1 to the input sample $x(q)$ is such an individual output signal. As is known, this individual output signal is thus equal to the product of this input sample and the impulse response of this filter. If this impulse response is represented by the function $h(v)$, this individual output signal can mathematically be expressed as follows:

$$z_{x(q)}(t) = x(q)h(t - t_{x(q)}) \quad (1)$$

in which $t_{x(q)}$ represents the instant at which the input sample $x(q)$ occurs. Let it be assumed that for this instant it holds that:

$$t_{x(q)} = qT_i$$

$$T_i = 1/f_i \quad (2)$$

so that $$z_{x(q)}(t) = x(q)h(t - qT_i) \quad (3)$$

Figure 2:
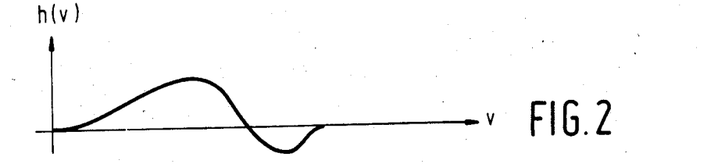
FIG. 2 shows the finite impulse response of the "analog" filter used in the filter arrangement shown in FIG. 1.

The impulse response $k(v)$ is indeed defined for all values of $v$, but it will be assumed that it assumes values unequal to zero only at a finite interval. Therefore this filter 1 is sometimes called a FIR-filter (=Finite Impulse Response-filter). Let it be assumed that this impulse response has the shape shown in FIG. 2. If now the input samples $x(q)$ occur at the instants $qT_i$ as they are shown at A in FIG. 3, then all the individual output signals are known. Some of these individual output signals, namely those for $q = -3, -2, -1, 0, 1, 2$ are shown at B, C, D, E, F, G in FIG. 3. Herein it is assumed that $x(q) = 1$ for all values of the independent variable q. As mentioned in the foregoing, the actual output signal $z(t)$ of this filter 1 is formed by the mathematical sum of all the individual output signals. Since the impulse response is finite, also the number of individual output signals contributing to the ultimate output signal $z(t)$ is finite. Let it be assumed that of only M individual output signals this contribution is unequal to zero, that the filter is a causal filter and that the input signal sample applied last to the filter has the number q, then it holds that:

$$z(t) = \sum_{m=0}^{M-1} z_{x(q-m)}(t) \quad (4)$$

$$t < (q + 1)T_i$$

Figure 3:
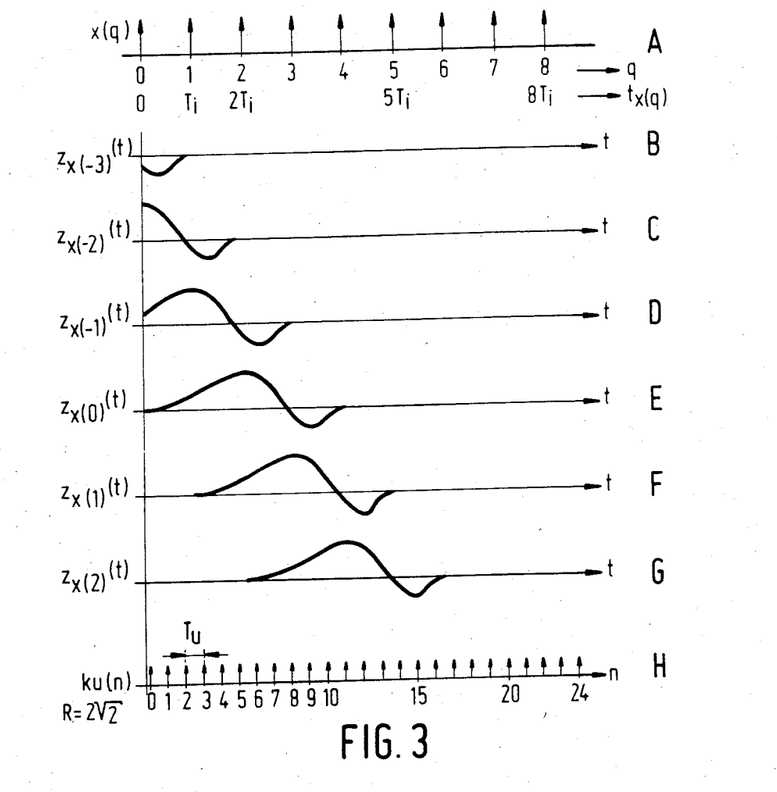
FIGS. 3 (A-H) shows some time diagrams to explain the filter arrangement of FIG. 1.

This output signal and consequently any of the individual output signals are now samples in the sampling arrangement 2 by, for example, the sequence of sampling pulses indicated at H in FIG. 3 and occurring at the output sampling frequency $f_u$, which is here chosen to be equal to $2f_i\sqrt{2}$. The $n^{th}$ sampling pulse will be denoted ku(n) and occurs at an instant $t_{ku(n)}$ which is defined by the expression:

$$t_{ku(n)} = t_o + nT_u \quad (5)$$

Herein $t_o$ represents an arbitrary time constant and it will also be assumed that $0 \leq t_o < T_u$. Thus, the sampling arrangement 2 produces a series of output samples, the output sample obtained in response to the $n^{th}$ sampling pulse ku(n) being denoted by y(n) and being defined by the expression:

$$y(n) = z(t_o + nT_u) = \sum_{m=0}^{M} x(q - m)h(t_o + nT_u - (q - m)T_i) \quad (6)$$

If more specifically $f_u$ is smaller than $f_i$, then a decimating filter arrangement is involved. If in contrast therewith $f_u$ exceeds $f_i$ an interpolating filter arrangement is involved. The following description will be based on interpolating filter arrangements and it will be assumed that $f_u = Rf_i$, wherein $R \geq 1$. In this connection this magnitude R is sometimes denoted as an interpolation factor.

As with an interpolating filter arrangement the output sampling frequency $f_u$ is higher than the input sampling frequency, a plurality of output samples occur in the time interval $T_q$ located between the two consecutive input samples $x(q)$ and $x(q+1)$. The number of the first output sample occurring in that time interval will be denoted by $n_q$ and the $r^{th}$ output sample in that interval by $n_{q+r}$. If further the distance between the first output sample $y(n_q)$ in this interval and the immediately preceding input sample $x(q)$ is denoted by $T_{d(q)}$, then it follows from expression (6) that:

$$y(n_q + r) = \sum_{m=0}^{M-1} x(q - m)h(T_{d(q-m)} + (n_q - n_{q-m} + r)T_u) \quad (7)$$

Herein:

$$T_{d(q-m)} = t_o + n_{q-m}T_u - (q-m)T_i \quad (8)$$

In expression (7) the quantities $h(T_{d(q-m)} + wT_u)$ represent the filter coefficients of the time-discrete filter arrangement. In the following paragraph these filter coefficients will be denoted for the sake of brevity by $a(d(q),w)$. The quantity $d(q)$ will be called the deviation component and is defined as follows:

$$d(q) = T_{d(q)}/T_u \quad (9)$$

E.(2) Some special values for R

In the preceding paragraph it was assumed that in principle the interpolation factor may have any random positive value exceeding or equal to unity. In this paragraph some special cases will be further described.

In the first case it is assumed that $R = 1$ so that $f_u = f_i$ and consequently $T_u = T_i$, it then further holds that:

$$r = 0$$

$$q - m = n_{q-m}$$

$$T_{d(q-m)} = t_o$$

$$n_q - n_{q-m} = mT_i$$

$$n_q = q \quad (10)$$

So that each output sample is determined by the expression:

$$y(q) = \sum_{m=0}^{M-1} x(q - m)h(t_o + mT_i) \quad (11)$$

Embodiments of time-discrete filter arrangements whose operation is fully defined by expression (11) are extensively described in chapter 9 of Reference 7 and in Reference 8, as well as in many other publications.

In the second case it is assumed that $R > 1$. Now a distinction can be made between the event in which R is an integer and the event in which R is not an integer.

If R is an integer then it holds that:

$$r = 0, 1, 2, \ldots R-1$$

$$T_i = RT_u$$

$$T_{d(q)} = t_o \quad (12)$$

So that each output sample is now defined by the expression:

$$y(Rq + r) = \sum_{m=0}^{M-1} x(q - m)h(t_o + rT_u + mT_i) \quad (13)$$

Embodiments of such interpolating time-discrete filter arrangements are extensively described in, for example, References 1, 3 and 4.

For the event that an interpolation factor R must be realised which is not an integer but is indeed rational, so that it can be written as a quotient of two integers, for example $R = L/P$, a decimating time-discrete filter arrangement having a decimation factor P can then be arranged in cascade with an interpolating time-discrete filter arrangement having an interpolation factor L. Interpolating time-discrete filter arrangements of this type are described in, for example, References 3, 5 and 6.

The situation is quite different if the interpolation factor R is not an integer and also non-rational. In that case the number of output samples occurring between two consecutive input samples is not always the same. Let it be assumed that this number is not more than R', then a group of a total of $W = MR'$ filter coefficients $a(d(q),w)$ must be available for calculating all the output samples. In accordance with expression (7), these filter coefficients are then obtained from the expression:

$$a(d(q),w) = h(T_{d(q)} + wT_u)$$

$$w = 0, 1, 2, \ldots MR' \quad (14)$$

As also $T_{d(q)}$ now changes from input sample to input sample, also the filter coefficients of the group change their values continuously. Embodiments of interpolating time-discrete filter arrangements with a non-rational interpolation factor will be described in the following paragraph.

Figure 4:
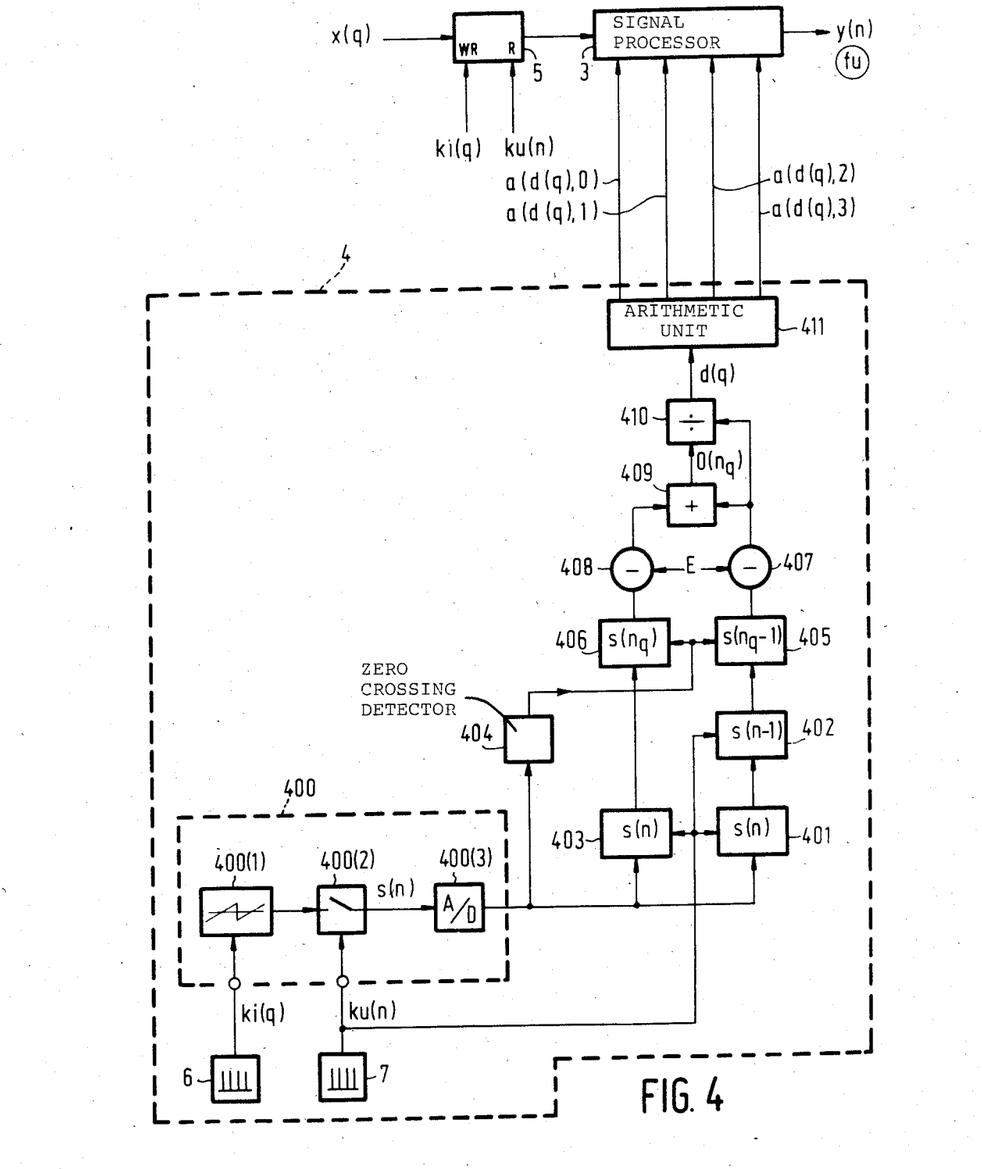
FIG. 4 shows an embodiment of the interpolating time-discrete filter arrangement according to the invention.

E(3) Interpolating time-discrete filter arrangement with a non-rational interpolation factor FIG. 4 shows schematically an embodiment of an interpolating time-discrete filter arrangement having a non-rational interpolation factor. In known manner it comprises a signal processing arrangement 3 and a filter coefficients generator 4. This signal processing arrangement 3 is preceded by a buffer store 5 to which the input samples x(q) are applied. Such an input sample x(q) is stored in this buffer store at the instant at which an input clock pulse ki(q) occurs at its write input WR. At the instant at which an output clock pulse ku(n) is applied to the read input R of this buffer store, the content of this buffer store is applied to the signal processing arrangement 3. Let it now be assumed that this buffer store is reset as a result thereof. If now the subsequent output clock pulse ku(n) occurs before a new input clock pulse ki(q) has occurred, then this buffer store supplies a signal sample having the value zero. The input clock pulses ki(q) are produced by a clock pulse generator 6 and occur with the input sampling frequency $f_i$. The output clock pulses ku(n) are produced by a clock pulse generator 7 and occur with the output sampling frequency $f_u$.

As is obvious from expression (7), the filter coefficients $a(d(q),w)$ cannot be calculated until the time interval $T_{d(q)}$ and consequently the deviation component $d(q)$ are known. As has already been remarked, this deviation component represents the ratio between the time interval $T_{d(q)}$ located between the input sample x(q) and the immediately subsequent output sample $y(n_q)$ and the output sampling period $T_u$ or, which is the same, the ratio between the time interval located between the instant $t_{ki(q)}$ at which an input clock pulse ki(q) occurs and the instant $t_{ku(n_q)}$ at which an immediately subsequent output clock pulse $ku(n_q)$ occurs and the interval $T_u$ between two consecutive output pulses.

In the filter coefficients generator 4 shown in FIG. 4 this deviation component d(q) is calculated in a particularly efficient way and with reference to the associated group of W filter coefficients. The generator comprises a, preferably digital, sawtooth generator 400 which produces at a rate $f_u$ digitally encoded samples of a periodic analog sawtooth-shaped signal which has a period $T_i$. For a better understanding, as shown in FIG. 4, the generator 400 may be assumed to comprise a sawtooth generator 400(1) which is controlled by the input clock pulses ki(q). This generator produces, for example, the analog sawtooth-shaped signal shown at A in FIG. 5 and varying between the values $+E$ and $-E$ and whose value suddenly changes from $+E$ into $-E$ at the instant an input clock pulse ki(q) occurs. For the sake of completeness, these input clock pulses are shown at B in FIG. 5. The analog sawtooth signal thus obtained is thereafter sampled in a sampling device 400(2) by the output clock pulses ku(n) at the instants $t_{ku(n)}$ such as they are shown, for example, at C in FIG. 5. Now this sampling device 400(2) produces the signal samples s(n) which are shown at A in FIG. 5 by means of arrows and are encoded digitally in an analog-to-digital converter 400(3). It will now be explained in greater detail how the deviation component d(q) can be determined.

Figure 5:
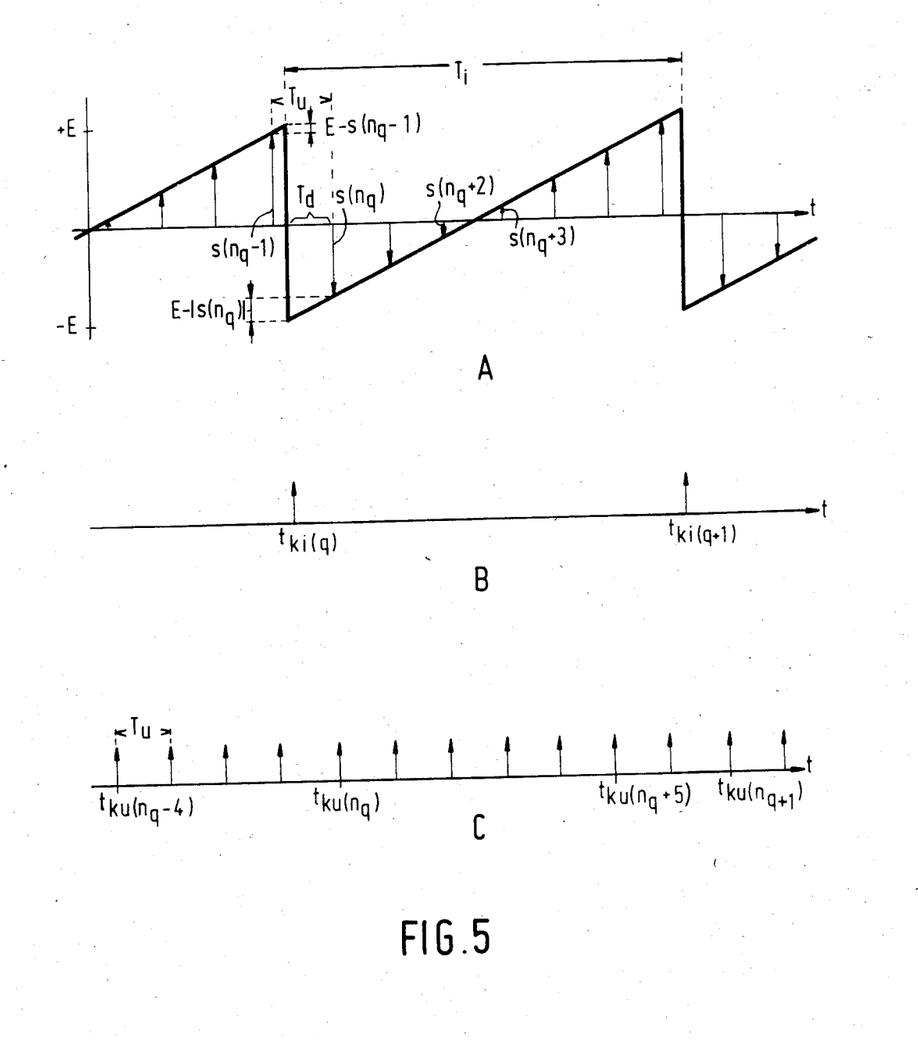
FIGS. 5 (A-C) shows time diagrams to explain the operation of the filter coefficients generator used in the embodiment shown in FIG. 4.

Let it be assumed that a given input clock pulse ki(q) occurs between the two consecutive output clock pulses $ku(n_{q-1})$ and $ku(n_q)$, the distance between these two last-mentioned clock pulses being $T_u$. The distance between ki(q) and $ku(n_q)$ is the time interval $T_{d(q)}$ looked for. If now the signal samples which can be taken from the sawtooth signal at the instants $t_{ku(n_q-1)}$ and $t_{ku(n_q)}$ have the respective values $s(n_q-1)$ and $s(n_q)$, then it follows from this planimetry that:

$$T_{d(q)} \div (T_u - T_{d(q)}) = (E - |s(n_q)|) \div (E - |s(n_q - 1)|)$$

so that $$d(q) = \frac{E - |s(n_q)|}{(E - |s(n_q)|) + (E - |s(n_q - 1)|)} \quad (15)$$

$$= \frac{E - s|(n_q)|}{0(n_q)}$$

From this it follows that the deviation component d(q) can be fully determined from the value of the signal samples of the sawtooth signal. As is further shown in FIG. 4 these signal samples s(n) are applied for this purpose to a cascade arrangement of two shift register elements 401 and 402 and to a shift register element 403. The contents of these shift register elements are shifted under the control of the output clock pulses ku(n). The signal samples s(n) are also applied to a zero-crossing detector circuit 404 which produces a detection pulse each time a signal sample of the positive polarity is followed by a signal sample of the negative polarity. This detection pulse is applied to the clock pulse inputs of two further shift register elements 405 and 406. The signal inputs thereof are connected to the signal outputs of the respective shift register elements 402 and 403. In response to this detection pulse the content of the shift register elements 405 and 406 become equal to $s(n_q-1)$ and $s(n_q)$, respectively. In subtracting arrangements 407 and 408 the absolute value of these signal samples is subtracted from the number E. The two difference components thus obtained are added together in an adder arrangement 409 and the sum component $0(n_q)$ thus obtained is divided in a divider stage 410 by the difference component produced by subtracting arrangement 407. The deviation component d(q) thus obtained is applied to an arithmetic unit 411 (for example a microcomputer) which is arranged to calculate at the given value of d(q) the required filter coefficients a(d(q),w) (four in the case described) in accordance with expression (14).

E(4) Special embodiments

Figure 6:
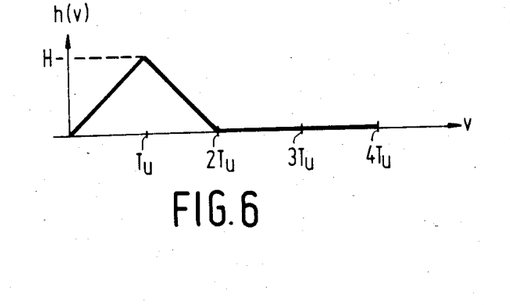
FIG. 6 shows a different form of the impulse response.

As in the coefficients generator whose embodiment is shown in FIG. 4 no restriction whatsoever is imposed on the shape of the impulse response h(v), a microcomputer 411 must be used to calculate the W(=4) filter coefficients, starting from the calculated value of the deviation component d(q). The use of a microcomputer is however not always necessary, for example when the impulse response has the shape shown in FIG. 6 and which is defined as follows:

$$h(v) = 0 \text{ for } v \leq 0 \text{ and } v \geq 2T_u \quad (16)$$

$$h(v) = \frac{v}{T_u} H \text{ for } 0 < v \leq T_u$$

$$h(v) = \left(2 - \frac{v}{T_u}\right) H \text{ for } T_u < v < 2T_u$$

Herein H represents a constant. From this it then follows that:

$$a(d(q),0) = d(q)H$$

$$a(d(q),1) = (1 - d(q))H$$

$$a(d(q),2) = 0$$

$$a(d(q),3) = 0 \quad (17)$$

Then, d(q) follows from expression (15) and it further holds that:

$$1 - d(q) = \frac{E - |s(n_q - 1)|}{(E - |s(n_q)|) + (E - |s(n_q - 1)|)}$$

$$= \frac{E - s(n_q - 1)}{0(n_q)}$$

Figure 7:
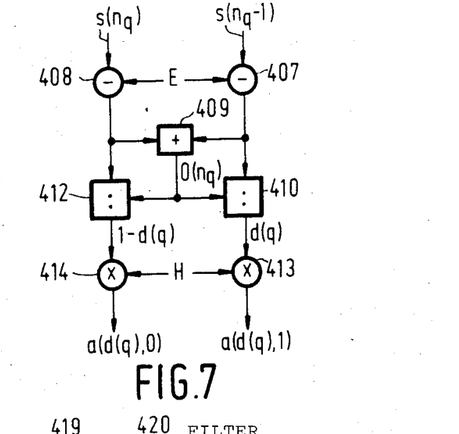
FIG. 7 shows a modification which can be made in the filter coefficients generator shown in FIG. 4, for the event in which the impulse response has the form shown in FIG. 6.

Put differently, in this case the factor $1-d(q)$ can be obtained by dividing the output signal of the subtracting arrangement 408 (see FIG. 4) by the sum component $0(n_q)$. For the sake of completeness, all this is shown schematically in FIG. 7. As is shown in this Figure, the output signal of the subtracting arrangement 408 is applied to a divider stage 412, which also receives the sum component $0(n_q)$ from adder arrangement 409. The output components of the two divider stages 410 and 412 are multiplied by the constant H in multiplier stages 413 and 414.

As in this case the sum component $0(n_q)$ is present in both d(q) and $1-d(q)$, one may alternately proceed as follows. Choose the filter coefficients as follows:

$$a(d(q),0) = E - |s(n_q)|$$

$$a(d(q),1) = E - |s(n_q - 1)|$$

$$a(d(q),2) = 0$$

$$a(d(q),3) = 0$$

The signal processing arrangement 3 now supplies output samples y'(n). Apply them to a multiplying circuit in which they are multiplied by $H/O(n_q)$, as a result of which the desired output samples y(n) can yet be obtained.

Figure 8:
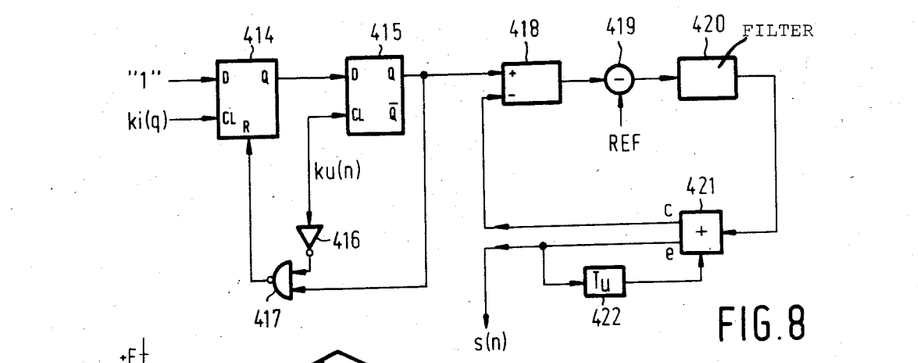
FIG. 8 shows a time-discrete sawtooth generator for use in the filter coefficients generator shown in FIG. 4.

In the coefficients generator shown in FIG. 4 the signal samples s(n) are obtained by sampling an analog sawtooth signal. A sawtooth generator which produces these signal samples in a fully digital way is shown in FIG. 8. The generator comprises an input circuit which includes the D flip-flop 414. The D-input thereof continuously receives the logic value "1". The clock input CL receives the input clock pulses ki(q) and the reset input R receives a reset signal. The Q-output of this D-flip-flop 414 is connected to the D-input of a D-flip-flop 415. The output clock pulses ku(n) are applied to the clock pulse input CL of this flip-flop. The pulses occurring at the Q-output of the D-flip-flop 415 and the output clock pulses ku(n) inverted in an inverter 416 are applied to a NAND-gate 417 the output pulses of which are applied as reset pulses to the reset input R of D-flip-flop 414. This input circuit formed by two D-flip-flops may, for example, be the dual D-flip-flop of the "74" series marketed by Signetics. The output pulses of D-flip-flop 415 are applied to a phase-locked loop (PLL) which is of a digital construction. This loop comprises an up/down counter 418 whose counting range is located in the range 0−2E. The output pulses of D-flip-flop 415 are applied to its up-counting input (+). The counting position of this counter 418 is applied with intervals $T_u$ to a digital low-pass filter 420 via a subtracting arrangement 419. In the subtracting arrangement 419 the counting position is reduced by a reference number REF which is, for example, equal to half (E) of the range (2E) of counter 418.

The low-pass filter 420 which has a bandwidth of less than 1 Hz, produces at a rate $f_u$ output numbers which are applied to an accumulator formed by an adder 421 and a delay network 422 whose time delay is equal to $T_u$. Adder 421 has two outputs denoted by c and e respectively. At the output c the (most significant) carry bit occurs of the word produced by the adder, whilst the remaining bits of this word occur at the output e. The output c is further connected to the down-counting input (−) of the up/down counter 418 and the output e represents at the same time the output of the sawtooth generator.

Figure 9:
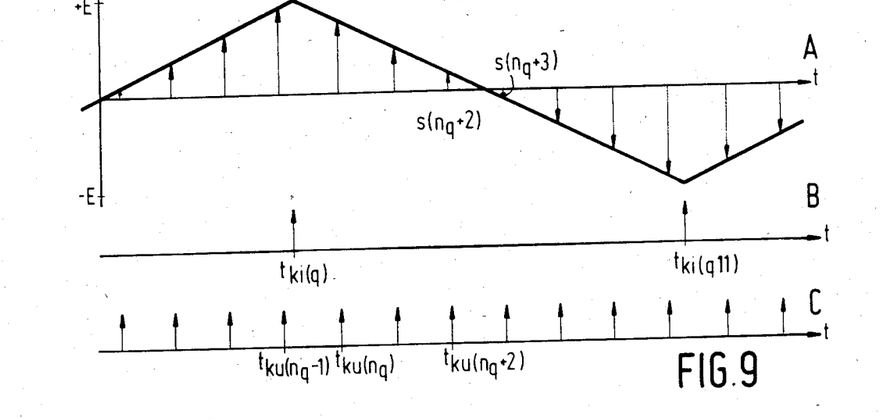
FIGS. 9 (A-C) shows some time diagrams to explain a further embodiment of the filter coefficients generator.

In the foregoing it was assumed that generator 400(1) produces a sawtooth signal. It is, however, alternatively possible to construct this generator such that it produces a signal which varies triangularly in the way as shown in, for example, FIG. 9. To determine the deviation component d(q) the two signal samples $s(n_q+2)$ and $s(q_n+3)$ may be the starting point. It should be noted that this is also possible for the case shown schematically in FIG. 5 where a sawtooth-shaped signal is involved. In that case the zero-crossing detector 404 must produce an output pulse for each signal sample having a negative polarity followed by a signal sample having a positive polarity.

The filter coefficients generator 4 operates as follows. The time interval $T_u$ between two consecutive output clock pulses ku(n) is distributed in an infinite number of sub-intervals $T_{uo}$ which are infinitely small. Thereafter it is determined between which two consecutive output clock pulses ku(n) the input clock pulse ki(q) is located and also in which sub-interval. The number of this sub-interval may be considered to be the deviation component d(q). The number of sub-intervals now depends on the number of bits by which one wants to represent d(q). If this number of bits is chosen such that a countable number of sub-intervals is obtained, the following procedure can be followed. The MR' filter coefficients a(d(q),w) associated with each value of the deviation component can be calculated in advance and stored in a storage medium. Let it be assumed that the deviation component can assume sixteen different values, then this storage medium contains, for example, 16 MR' filter coefficients. A selector to which the deviation component is applied and which depending on the value thereof selects the desired group from these sixteen groups of filter coefficients. In such cases the term "table look up" is sometimes used.

E(5) Embodiments of the signal processing arrangement

Figure 10:
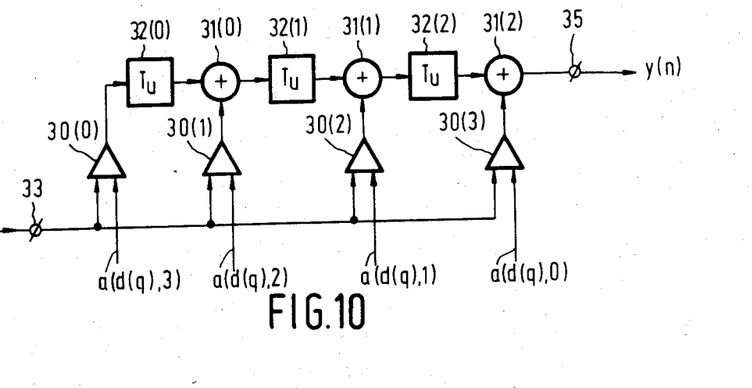
FIG. 10 and FIG. 11 show embodiments of the signal processing arrangement for use in the filter arrangement shown in FIG. 4.

A particularly suitable embodiment of the signal processing arrangement is known from FIG. 9.10 of Reference 7 and is shown in FIG. 10, for the sake of completeness. It comprises in known manner a number of MR' multiplying circuits 30(·). (4 in the embodiment shown), a plurality of adder circuits 31(·) and a plurality of delay circuits delay 32(·), each having a time delay $T_u$. Each multiplying circuit is connected by means of an input to the input 33 of the signal processing arrangement and thus receive the input samples x(q) simultaneously. In addition they receive via a filter coefficients inputs the required filter coefficients produce by the filter coefficients generator shown in FIG. 4. The desired output samples now occur at the output 35 of adder circuit 31(2).

Figure 11:
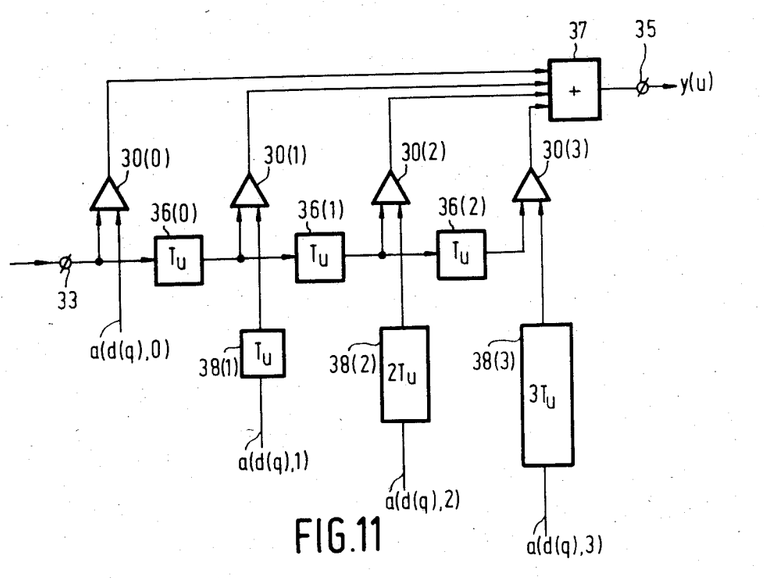

An alternative embodiment of the signal processing arrangement 3 is shown for the greater part in FIG. 9.1 of Reference 7 and, for the sake of completeness, is shown in FIG. 12. It comprises a cascade arrangement of a number of delay devices 36(·) (three in the embodiment shown), each having a time delay $T_u$. This cascade arrangement is connected to the input 33 of the signal processing arrangement. Inputs and outputs of the delay devices 36 (·) are connected via multiplying circuits 30(·) to inputs of an adder device 37, which supplies the desired output samples y(n) from its output 35. The multiplying circuits 30(·) receive the required filter coefficients via their filter coefficients inputs. In the case in which all the filter coefficients associated with a given value of the deviation component are supplied simultaneously by the filter coefficients generator 4 as suggested in FIG. 5, the filter coefficients a(d(q),0) are directly applied to the multiplying circuit 30(0), the filter coefficients a(d(q),1) are applied to the multiplying circuit 30(1) via a delay device 38(1) having a time delay $T_u$. Similarly, the filter coefficients a(d(q),2) and a(d(q),3) are applied to the respective multiplying circuits 30(2) and 30(3) via delay devices 38(2) and 38(3) having the respective time delays $2T_u$ and $3T_u$.

E(6) General remarks

In the foregoing it was assumed that the buffer store 5 (see FIG. 4) produces an input sample having the value zero for each output clock pulse produced, unless this output clock pulse occurs immediately after an original input sample had occurred. In practice it has however been found that it is alternatively possible to assign the value 1 to the said input sample instead of the value zero, however, this requires a modification of the original impulse response.

In the foregoing, calculating the deviation component d(q) was based on the time interval located between an input clock pulse ki(q) and the immediately preceding output clock pulse ku(n). It is, however, also permissible to define this deviation component as the quotient between the time interval located between an input clock pulse ki(q) and the immediately preceding output clock pulse ku(n−1) and the time interval $T_u$ between two consecutive output clock pulses.

What is claimed is:

1. An interpolating time-discrete filter arrangement having a non-rational interpolation factor R for converting a time-discrete input signal formed by a sequence of input samples x(q), $q = \ldots -2, -1, 0, 1, 2, 3, \ldots$ with which an input sampling frequency $f_i$ is associated into a time-discrete output signal formed by a sequence of output samples y(n), $n = \ldots -2, -1, 0, 1, 2, 3, \ldots$ and with which an output sampling frequency $f_u$ is associated which is R-times higher than the input sampling frequency $f_i$, comprising:

(a) first means for producing input clock pulses ki(q) occurring at the said input sampling frequency $f_i$;

(b) second means for producing output clock pulses ku(q) occurring at the output sampling frequency $f_u$;

(c) a filter coefficients generator for producing a group of W filter coefficients, the generator comprising:

(c1) means to which the input clock pulses and the output clock pulses are applied and which in response to each input clock pulse ki(q) supplies a deviation component d(q) whose magnitude is proportional to the relationship between the time interval $T_{d(q)}$ located between that input clock pulse ki(q) and the immediately subsequent or the immediately preceding output clock pulse and the time interval $T_u = 1/f_u$ between two consecutive output clock pulses;

(c2) means for generating the group of W filter coefficients in response to the deviation component d(q) supplied, the filter coefficient having number w being equal to d(d(q),w) and being defined by the expression $$d(d(q),w) = h(d(q)T_u + wT_u)$$

$w = 0, 1, 2, \ldots, W-1$ wherein h(v) represents the impulse response of a FIR filter, v is a continuous variable in the interval $-\infty < v < \infty$ (d) a signal processing arrangement for generating the output samples y(n) by multiplying input samples by selected filter coefficients and adding together the products thus obtained.

2. A filter arrangement as claimed in claim 1, in which the means for supplying the deviation component comprises a generator producing at a rate $f_u$ signal samples which characterize a periodic signal having a period $1/f_i$ and which signal varies linearly in time between two limit values.

3. A filter arrangement as claimed in claim 2, in which the means for supplying the deviation component further comprises selection means for selecting those two consecutive signal samples of which one is located above and the other below a predetermined limit value.

4. A filter arrangement as claimed in claim 3, wherein the said periodic signal is of a sawtooth shape, the two limit values are +E and −E, respectively and the said predetermined limit value is the value zero.

5. A filter arrangement as claimed in claim 4, in which the means for supplying the deviation component comprises subtracting means for forming two difference components, the first one of which is equal to the difference between the limit value E and the absolute value of the first selected signal sample and the second is equal to the difference between the limit value E and the absolute value of the second selected signal sample, adder means for adding together the two difference components for forming a sum component, means for dividing at least one of the two difference components by the sum component.

* * * * *